United States Patent [19]
Edelman

[11] Patent Number: 5,492,123
[45] Date of Patent: Feb. 20, 1996

[54] DIFFUSION WEIGHTED MAGNETIC RESONANCE IMAGING

[75] Inventor: Robert R. Edelman, Wellesley, Mass.

[73] Assignees: Siemens Medical Systems, Inc., Iselin, N.J.; Beth Isreal Hospital, Boston, Mass.

[21] Appl. No.: 106,228

[22] Filed: Aug. 13, 1993

[51] Int. Cl.⁶ .................................................. A61B 5/055
[52] U.S. Cl. ............................... 128/653.2; 128/653.4; 128/708
[58] Field of Search ............................ 128/653.2, 653.3, 128/653.4, 708; 324/307, 309, 306

[56] References Cited

U.S. PATENT DOCUMENTS

| | | | |
|---|---|---|---|
| 5,079,503 | 1/1992 | Siebold et al. | 324/309 |
| 5,084,675 | 1/1992 | Erich et al. | 324/309 |
| 5,162,730 | 11/1992 | Schmitt et al. | 324/309 |

FOREIGN PATENT DOCUMENTS

| | | |
|---|---|---|
| 0076054 | 9/1982 | European Pat. Off. . |
| 429715A1 | 12/1989 | European Pat. Off. . |

OTHER PUBLICATIONS

Koresec et al., "Ultra-Fast MR Angiography Using A Velocity-Selective Prep Pulse and many Readouts" p. 214.
Frahm et al., "High-Speed STEM MRI of the Human Heart" *Magnetic Resonance in Medicine* 22:133–142 (1991).
Zhang et al., "Measurement of Rat Brian Perfusion by NMR Using Spin Labeling of Arterial Water: In Vivo Determination of the Degree of Spin Labeling" *MRM* 29:416–421 (1993).
Moseley et al., "Diffusion-weighted MR Imaging of Anisotropic Water Diffusion in Cat Central Nervous System" *Radiology*, 176:439–445 (1990).
Edelman, "MR Angiography: Present and Future", *AJR*, 161:1–11 (1993).
Le Bihan, "Molecular Diffusion Nuclear magnetic Resonance Imaging" *Magnetic Resonance Quarterly*, 7(1):1–30 (1991).
Beaulieu et al., "Diffusion-Weighted MR Microscopy with Fast Spin-Echo" *MRM*, 30:201–206 (1993).
Warach et al., "Fast Magnetic Resonance Diffusion-Weighted Imaging of Acute Human Stroke" *Neurology*, 42:1717–1723 (1992).
Morvan et al., "Simultaneous Temperature and Regional Blood Volume Measurements in Human Muscle Using an MRI Fast Diffusion Technique" *MRM*, 29:371–377 (1993).
Stehling et al., "Whole-Body Echo-Planar MR Imaging at 0.5T$^1$", *Radiology*, 170:257–263 (1989).
Moseley et al., "Diffusion-Weighted MR Imaging of Acute Stroke: Correlation with T2–Weighted and magnetic Susceptibility–Enhanced MR Imaging in Cats" *Amer. J. Neuralradiology*, 11:423–429 (May/Jun. 1990).

*Primary Examiner*—Ruth S. Smith
*Attorney, Agent, or Firm*—Mark H. Jay

[57] ABSTRACT

The present invention relates to the use of diffusion weighted magnetic resonance imaging procedures for the diagnosis of conditions in which blood circulation or similar molecular displacements within biological tissues are measured. Pulse sequences are used in accordance with the invention which suppress the contribution of non-moving tissue or bulk motion.

14 Claims, 4 Drawing Sheets

DIFFUSION WEIGHTED MAGNETIC RESONANCE IMAGING

BACKGROUND

Stimulated echo magnetic resonance (MR) imaging methods were first described several decades ago. The basic concept is to tip the proton magnetization into the longitudinal (−z) direction, wait for a period of time, and then tip the magnetization back into the transverse (x−y) plane. This results in the production of a stimulated-echo magnetic resonance signal. However, such methods are intrinsically slow, because of the need to allow time for longitudinal (T1) relaxation between sequential acquisitions of the multiple phase-encoding steps needed to create an MR image. Images with low spatial resolution have been acquired by using a process consisting of radio frequency pulses, a dephasing magnetic field gradient, a single shot gradient-echo type acquisition, and a dephasing gradient placed after each radio frequency pulse. However, this method is not generally useful for clinical applications because of artifacts and because the spatial resolution is not sufficient.

Diffusion is a process of random translational motion of molecules. Methods for using nuclear magnetic resonance to study diffusional processes have been proposed including a procedure in which the signal intensity is related to these diffusional processes. Using animal models of brain ischemia, for example, it has been shown that the measurement of diffusion was a sensitive indicator of ischemia.

A continuing need exists, however, for further advances in systems and procedures used in performing magnetic resonance imaging for diagnostic purposes and in particular for measuring and imaging of diffusion in biological tissues.

SUMMARY

The present invention relates to magnetic resonance imaging (MRI) techniques in which an initial preparation of the proton magnetization is performed by two or more radio frequency pulses which cause all, or a portion of, the proton magnetization in the imaging volume of a patient to be oriented longitudinally (i.e. along the −z axis). After a period of time referred to herein as the wait time or the "delay period", a fast imaging sequence is applied. This fast imaging sequence provides for the acquisition of data necessary to generate the desired image or measurement of diffusion in a sufficiently short period of time, referred to herein as the "data acquisition period", to substantially reduce or eliminate artifacts generated by the motion of the patient. By performing data acquisition over a period of less than 200 milliseconds, and preferably in the range of 50–100 milliseconds, a substantial reduction in motion artifacts is achieved. These sequences are used to image and measure diffusion processes in humans and animals to provide diagnostic information.

Examples of fast imaging pulse sequences include echo planar imaging, in which all the data is acquired after a single radio frequency excitation, as well as any segmented pulse sequences in which the data are collected over multiple time intervals as groups of two or more rapidly acquired phase-encoding steps. The echo planar imaging system used in a preferred embodiment of performing the stimulated echo-echo planar process of the present invention provides a resolution of 3 mm or smaller, and due to the use of a single shot before the data acquisition period that is preferably 90°, a substantial improvement in the signal to noise ratio is realized.

Systems suited for echo planar imaging are described in greater detail in U.S. Pat. Nos. 5,084,675, 5,079,503 and 5,162,730, the contents of which are incorporated herein by reference. Also incorporated herein is German Patent DE 4139509.

Segmented pulse sequences used in accordance with the present invention include, but are not limited to, segmented turbo FLASH (fast low angle shot) and other segmented gradient-echo methods, rapid acquisition with relaxation enhancement (RARE), and spiral scanning. When using a segmented sequence, each data acquisition period occurs in less than the 200 millisecond period wherein each segment can be physiologically gated relative to the next segment in the sequence as required by the particular application.

Applications for these techniques include the suppression of signals from protons undergoing motion including bulk motion and diffusion. Clinical applications of these procedures include the measurement and mapping of molecular diffusion and creation of MR images in which flowing blood undergoing macrocirculation or microcirculation within biological tissue is rendered dark.

The application of diffusion imaging techniques to organ systems, most importantly the heart, but also the liver, kidneys, and other abdominal and pelvic organs, is of great clinical significance. Unfortunately, previously described diffusional imaging methods have suffered from sensitivity to bulk motion of any kind, including cardiac pulsation and respiratory motion. This problem has precluded effective diffusion-weighted imaging of the heart; moreover, respiratory motion degrades diffusion-weighted images of the abdominal and pelvic organs.

By using a fast stimulated-echo imaging method as described above, a motion-resistant method for diffusion-weighted magnetic resonance imaging has been developed and implemented that overcomes these problems. By using "diffusion weighted" gradient pulses, molecules within the volume of tissue to be imaged are magnetically labeled and act as endogenous markers that are monitored using well known diffusion measurement methods. This procedure provides for the measurement of molecular displacements in the micron and submicron range. In particular, preferred embodiments include the measurement of moving molecules in heart muscle or surrounding tissue, inflammatory processes, ischemia, post surgical and traumatic injuries, organ rejection, or responses to drugs generally, and the organization of cells or particular molecular pathways.

Diffusion-weighted images in patients with stroke have been produced that can detect brain ischemia at a much earlier stage than conventional MRI techniques. See, for example, the work of S. Warach et al., "Fast Magnetic Resonance Diffusion-weighted Imaging of Acute Human Stroke", *Neurology*, Vol. 42, No. 9, 1717–1723, September 1992, which is incorporated herein by reference. This procedure, however, utilized a period for data acquisition that was too long and thus too sensitive to motion generated artifacts.

Gating procedures using electrocardiographic or pulmonary monitoring, or other motion detection procedures, can be used to calibrate acquired data to reduce or eliminate the effects of motion which the patient may be undergoing.

DETAILED DESCRIPTION

A preferred embodiment of the diffusion imaging method of the present invention uses a modification of a stimulated echo pulse sequence to produce images of, or measure diffusional processes in organs undergoing motion. This sequence can include two or more initial radio frequency pulses separated by a diffusion-sensitizing magnetic field gradient. After a waiting period, a third radio frequency pulse is applied followed by another magnetic field gradient identical in amplitude to the diffusion-sensitizing gradient. The diffusion sensitivity of the sequence depends on the diffusion gradient strength, the gradient duration, and the diffusion time. These gradient-timing factors have been grouped together and referred to as the "b value". Using the diffusion time corresponding to that of the central phase encoding step, the b value can be approximated by: $b=\gamma^2\delta^2G^2(\Delta-\delta/3)$, where $\gamma$ is the gyromagnetic ratio, $\delta$ is the gradient duration, G is the gradient strength, and $\Delta$ is the diffusion time. The apparent diffusion coefficient (ADC) can be calculated from the equation: $ADC=-\ln(SI_2/SI_1)/b$, where $SI_1$ is the regional signal intensity from the images acquired with no diffusion gradients and $SI_2$ is the regional signal intensity with diffusion gradients. In a preferred embodiment in which anatomy is to be imaged with blood rendered dark, the b value is about 50 or less. In another preferred embodiment for imaging diffusion within biological tissues b values are greater than 50.

Figure 1:
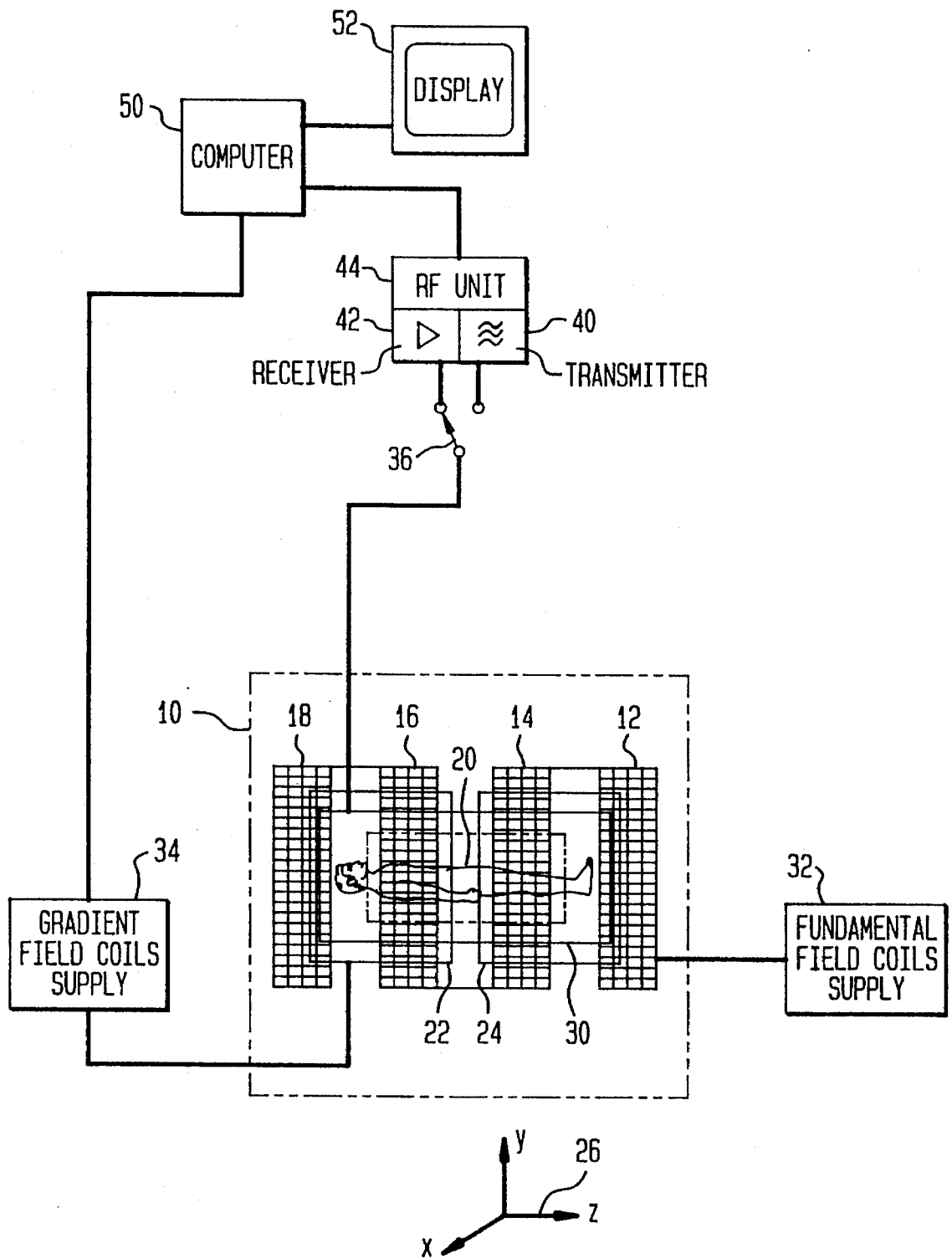
FIG. 1 schematically illustrates a preferred embodiment of a magnetic resonance imaging system to be used in accordance with the invention.

A system for acquiring the data and generating the images is shown in FIG. 1. This system can be a 1.5T MR whole-body system available from Siemens Medical System, Inc., Iselin, N.J., or any other suitably equipped MRI system. A whole body MR system suitable for a preferred embodiment of the present invention includes a main magnet assembly 10 in which a patient 20 is positioned during data acquisition. The computer 50 is programmed to control the desired pulse sequence and the recording of data, and can be used to make quantitative measurements of diffusion within a selected region of interest.

The basic components of a conventional nuclear magnetic resonance tomography apparatus are shown in FIG. 1. Coils 12, 14, 16 and 18 generate a static, fundamental magnetic field in which, if the apparatus is used for medical diagnostics, the body of a patient 20 to be examined is situated. Gradient coils are provided for generating independent orthogonal magnetic field components in the x, y and z directions, according to the coordinate system 26. For clarity, only gradient coils 22 and 24 are shown in FIG. 1, which generate the x-gradient in combination with a pair of identical gradient coils disposed on the opposite side of the patient 20. Sets of y-gradient coils (not shown) are disposed at the head and feed of the body 20 extending transversely relative to the longitudinal axis of the body 20. Each gradient coil uses an amplifier operating at 300 V, a current of 250 Amps, at a resonant frequency of 1 KHz. This system produces gradient amplitudes up to 38 millitesla/meter. The time to peak gradient amplitude for the preferred embodiment is in the range of 250–500 microseconds. In order to produce diffusion sensitive gradients in accordance with the present invention it is preferred to operate at gradient amplitudes above about 15 millitesla/meter.

The apparatus also includes an RF coil 30 which excites selected nuclei in the body 20 so that nuclear magnetic resonance signals are generated, and also serves to acquire the resulting nuclear magnetic resonance signals.

The system bounded by a dot-dash line 10 represents the actual examination instrument. The instrument is operated by an electrical arrangement which includes fundamental field coils supply 32 for operating the coils 12, 14, 16 and 18 and a gradient fields coils supply 34 for operating the gradient coils 22 and 24 and the further gradient coils.

Via a switch 36, the RF coils 30 can be connected to an RF transmitter 40 in a excitation mode, or to an amplifier 42 in a signal reception mode. The amplifier 42 and the transmitter 40 are a part of an RF unit 44 which is connected to a process control computer 50. The computer 50 is also connected to the gradient fields coils supply 34. The computer 50 constructs an image from the nuclear magnetic resonance signals, which is portrayed on a display 52.

A number of pulse sequences are known for operating the RF unit 44 and the gradient coils. Methods have prevailed wherein the image generation is based on a two-dimensional or three-dimensional Fourier transformation. One such method is the aforementioned echo planar imaging method.

In order to eliminate artifacts from motion, three procedures can be employed. First, the images are acquired during a breath-holding period or with very quiet breathing to suppress artifacts from respiratory motion. Second, in order to suppress artifacts from cardiac motion, the first and third radio frequency pulses are synchronized to similar time points in different cardiac cycles. For instance, in a preferred embodiment one can synchronize the first radio frequency pulse to a time delay of 250 milliseconds after one R-wave, and the third radio frequency pulse also to a time delay of 250 milliseconds after another R-wave. The duration of the R—R interval, or a multiple thereof, partly determines the sensitization of the pulse sequence to diffusional processes. Synchronization to the cardiac cycle can be obtained by any of a number of methods including electrocardiographic gating or peripheral pulse gating. The third procedure involves obtaining images acquired using a sub-second acquisition method. In the preferred embodiment, this method is echo planar imaging, but other embodiments include segmented pulse sequences described in greater detail below.

Figure 2:
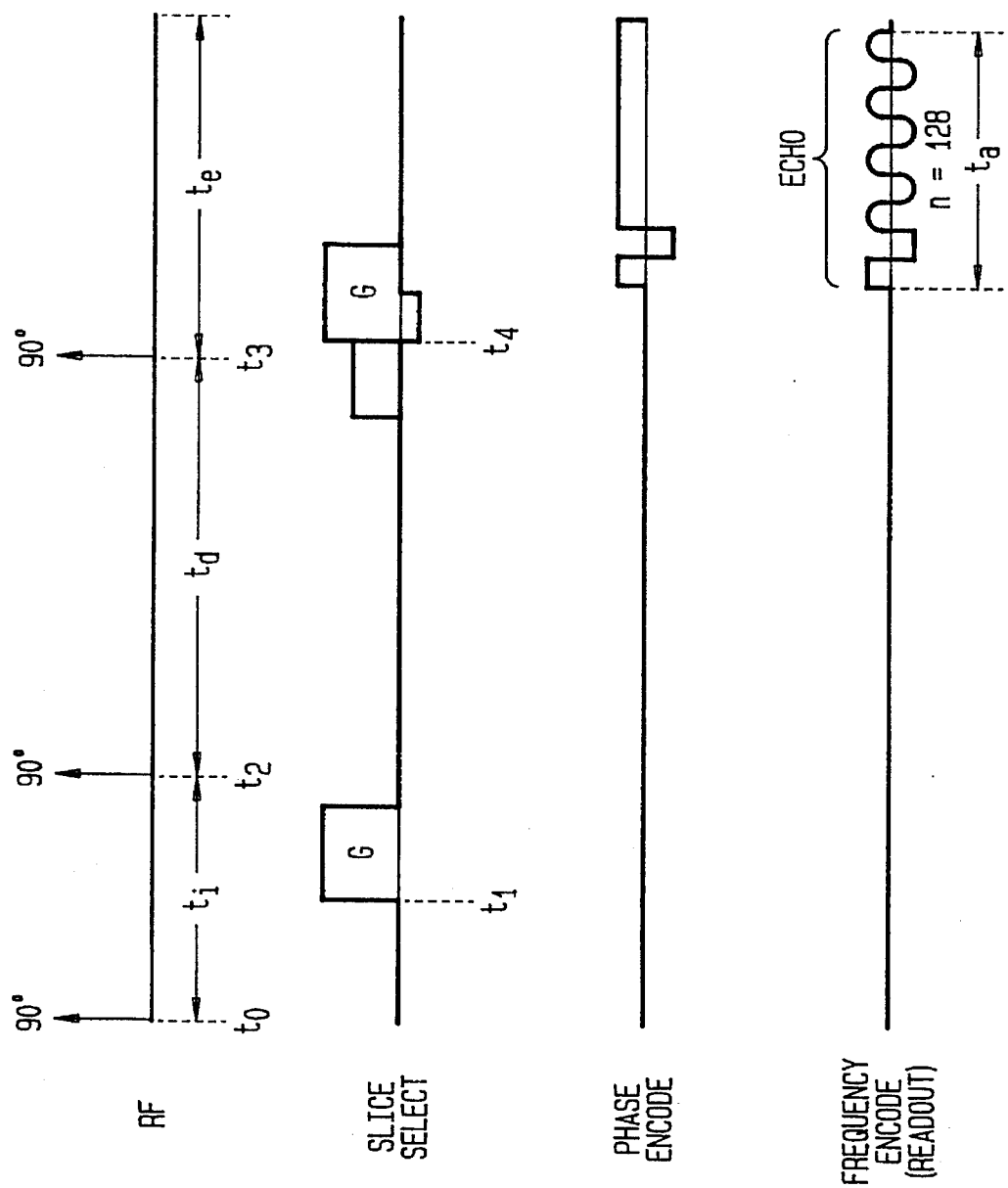
FIG. 2 schematically illustrates a pulse sequence used in accordance with a preferred embodiment of the invention.

A preferred pulse sequence is the echo planar imaging sequence illustrated in FIG. 2 in which a first 90° RF signal is applied at time $t_o$, a first diffusion sensitive gradient is applied at time $t_1$ and a second 90° RF signal is applied at time $t_2$. After a selected time delay $t_d$, a third 90° RF signal is applied at time $t_3$, followed by a second gradient pulse at time $t_4$. After the end of the second RF signal at time $t_2$, part of the transverse magnetization is stored as longitudinal magnetization, which becomes insensitive to field inhomogeneities and decays according to relaxation time T1. Phase encode and frequency encode gradients can then be applied at a selected time during or after the second gradient pulse at $t_4$. The phase encoding gradient can be continuous as shown or a "blip" encoding gradient. The frequency encoding gradient can be trapezoidal or sinusoidal. The diffusion sensitive gradients at $t_1$ and $t_4$ can be single pulses, or one or both of these can be performed as a plurality of pulses.

The integral of the diffusion sensitive gradient (or gradients) applied during period $t_i$ should be about equal to the integral of the gradient (or gradients) occurring at time $t_4$.

The total data acquisition period $t_a$ is about 200 milliseconds or less and is preferably in the range of 50–100 milliseconds. The delay period $t_d$ is generally in the range of 100 to 2000 ms and preferably is in the range of 400 to 1000 ms. In applications involving cardiac gating the period $t_d$ is defined by the R—R interval minus $t_i$.

Figure 3:
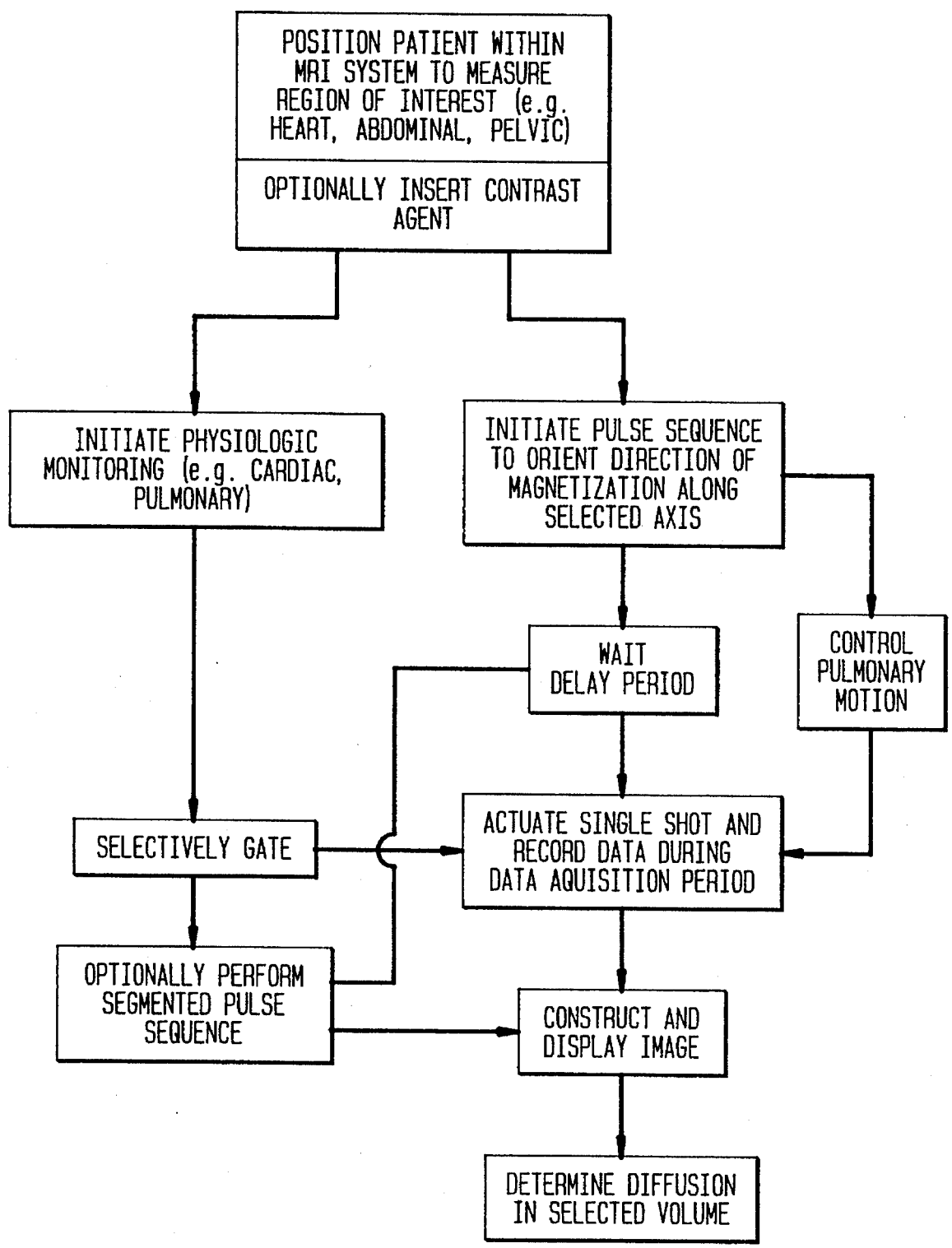
FIG. 3 is a schematic illustration of methods in accordance with a process flow sequence illustrating use of preferred embodiments of the invention in a clinical setting.

FIG. 3 is a process flow sequence illustrating preferred embodiments of methods used in accordance with the invention. After positioning the patient, a sensor used to monitor the motion of the patient is used to generate a gating signal to control timing of the pulse sequence. As shown in detail in FIG. 2, a pulse sequence is performed including a delay period prior to the data acquisition period. Depending upon the specific region of interest on which a study is being performed, the pulmonary motion of the patient can be controlled by having the patient slow or stop breathing during data acquisition. If a segmented sequence is being used, each segment can be gated as necessary.

The diffusion-weighted image can be acquired in as little as two heart beats. Longer acquisitions can also be used in which diffusion-weighted images are summed over many heart beats using techniques such as segmented k-space acquisitions.

Other preferred embodiments of this technique incorporate methods that correct for motion-related phase or amplitude shifts, including the acquisition of additional echoes that are not phase-encoded.

There are a number of diffusion-weighted imaging techniques that incorporate any of the procedures described herein. For example, the present invention can be used in conjunction with an MRI-contrast agent such as Gd-DTPA or iron oxides.

Figure 4:
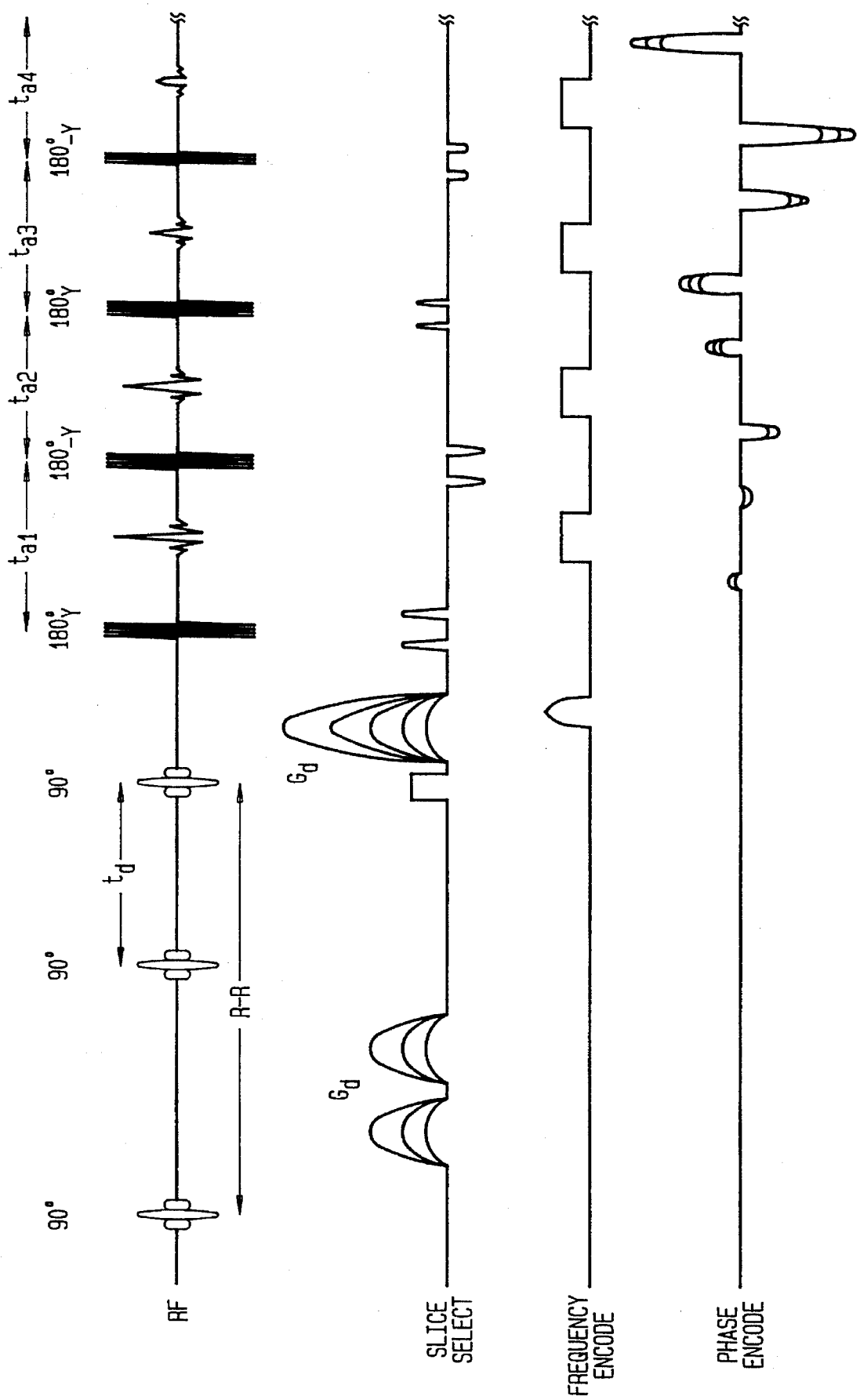
FIG. 4 schematically illustrates another preferred embodiment of a segmented pulse sequence to be used in accordance with the invention.

In addition to the use of an echo-planar procedure, segmented pulse sequences, such as the sequence illustrated in FIG. 4, provide for data collection over multiple time intervals. A so-called turbo FLASH sequence is specifically characterized by a train of gradient echoes for imaging purposes with acquisition times for each echo being less than 200 milliseconds and preferably in the range of 50 ms–100 ms. Sensitization to diffusion can be obtained by a preparatory sequence placed in front of the gradient echo train. In this example, a first 90° pulse is followed by a pair of diffusion sensitive gradient pulses $G_d$. A second 90° pulse is followed by the delay period $t_d$ and a third 90° pulse timed at the R—R interval relative to the first 90° pulse. A third diffusion sensitive pulse $G_d$, or alternatively a plurality of such pulses is then performed followed by a series of segmented pulses. Each segment has an acquisition period $t_{a1}$, $t_{a2}$, $t_{a3}$, $t_{a4}$, etc. such that each period is less than 200 ms. Each segment generates an image, some or all of which can be averaged or summed to provide an improved image of the diffusion process under study. Other gradient echo methods include rapid acquisition with relaxation enhancement (RARE) or spiral scanning. These methods, when applied to diffusion measurements in accordance with the present invention, employ data acquisition within the above described acquisition periods to control motion generated artifacts.

EQUIVALENTS

Those skilled in the art will recognize or be able to ascertain, using no more than routine experimentation, many equivalents to the specific embodiments of the invention described herein. Such equivalents are intended to be covered by the following claims.

I claim:

1. A method for motion compensated, diffusion-weighted magnetic resonance imaging comprising:

applying a first radio frequency pulse to an imaging volume;

applying at least one first magnetic field gradient to the imaging volume, said at least one first magnetic field gradient being diffusion sensitive;

applying a second radio frequency pulse;

waiting a selected delay period and applying a third radio frequency pulse that is synchronized with a cardiac cycle relative to the first radio frequency pulse;

applying a second magnetic field gradient to the imaging volume; and acquiring data during a data acquisition period of less than about 200 milliseconds and forming an image of the imaging volume with the acquired data.

2. The method of claim 1 wherein said radio frequency pulses are part of an echo planar pulse sequence.

3. The method of claim 1 wherein the method comprises controlling a respiratory motion during the application of the first, second and third radio frequency pulses.

4. The method of claim 1 wherein the first and third radio frequency pulses are synchronized using electrocardiographic gating or peripheral pulse gating.

5. The method of claim 1 wherein there are a plurality of diffusion sensitive gradients applied between the first radio frequency pulse and the second radio frequency pulse.

6. The method of claim 1 wherein said acquiring step is carried out during a plurality of cardiac cycles.

7. The method of claim 1 further comprising introducing a contrast agent into the imaging volume.

8. The method of claim 1 further comprising determining a diffusion coefficient from the acquired data.

9. A method for diffusion-weighted magnetic resonance cardiac imaging comprising:

applying a first radio frequency pulse to an imaging volume including a cardiac region;

applying a diffusion sensitive magnetic field gradient to the imaging volume;

applying a second radio frequency pulse to the imaging volume;

waiting a selected delay period and applying a third radio frequency pulse to the imaging volume that is synchronized with a cardiac cycle relative to the first radio frequency pulse;

applying a second magnetic field gradient to the imaging volume; and recording data during a data acquisition period of less than 200 milliseconds and forming an image of the imaging volume with the recorded data.

10. The method of claim 9 wherein the method further comprises controlling a respiratory motion during the application of the first, second and third radio frequency pulses.

11. The method of claim 9 wherein the first and third radio frequency pulses are synchronized using electrocardiographic gating or peripheral pulse gating.

12. The method of claim 9 wherein said recording step is carried out during a plurality of cardiac cycles.

13. The method of claim 9 further comprising introducing a contrast agent into the imaging volume.

14. The method of claim 9 further comprising determining a diffusion coefficient from the recorded data.

* * * * *